US010789933B1

(12) United States Patent
Li et al.

(10) Patent No.: US 10,789,933 B1
(45) Date of Patent: Sep. 29, 2020

(54) FREQUENCY DOMAIN COEFFICIENT-BASED DYNAMIC ADAPTATION CONTROL OF ADAPTIVE FILTER

(71) Applicant: Cirrus Logic International Semiconductor Ltd., Edinburgh (GB)

(72) Inventors: Ning Li, Cedar Park, TX (US); Dayong Zhou, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/516,618

(22) Filed: Jul. 19, 2019

(51) Int. Cl.
*G10K 11/178* (2006.01)

(52) U.S. Cl.
CPC ......... *G10K 11/17854* (2018.01); *G10K 2210/1081* (2013.01); *G10K 2210/3028* (2013.01); *G10K 2210/3044* (2013.01)

(58) Field of Classification Search
CPC ......... G10K 11/1785; G10K 11/17853; G10K 11/17854; G10K 2210/1081; G10K 2210/3028; G10K 2210/3025; G10K 2210/3044
USPC ................... 381/71.1, 71.11, 71.14
See application file for complete search history.

(56) References Cited

U.S. PATENT DOCUMENTS

| | | |
|---|---|---|
| 9,324,311 B1 | 4/2016 | Abdollahzadeh Milani et al. |
| 9,502,020 B1 | 11/2016 | Abdollahzadeh Milani et al. |
| 9,633,646 B2 | 4/2017 | Hendrix et al. |
| 2009/0060167 A1 | 3/2009 | Deng et al. |
| 2012/0195439 A1* | 8/2012 | Ohta ................ G10K 11/178 381/71.4 |
| 2013/0315408 A1* | 11/2013 | Yano ................ G10K 11/178 381/66 |
| 2017/0142532 A1* | 5/2017 | Pan ................ G10K 11/178 |
| 2017/0178617 A1* | 6/2017 | Christoph ........ G10K 11/17853 |
| 2017/0276398 A1* | 9/2017 | Hanazono ........... F24C 15/2042 |
| 2020/0043461 A1* | 2/2020 | Zollner ............... G10K 11/178 |

OTHER PUBLICATIONS

Zhou, Dayong et al. "A New Rapid Frequency-Domain Adaptation of Casual Fir Filters." IEEE DSP Workshop. Sep. 2006. pp. 332-335.

(Continued)

*Primary Examiner* — Jason R Kurr
(74) *Attorney, Agent, or Firm* — E. Alan Davis; James W. Huffman

(57) ABSTRACT

An adaptive filter calculates frequency domain coefficients and in the frequency domain dynamically adjusts a leakage/step size parameter that controls adaptation of the adaptive filter based on the calculated frequency domain coefficients (e.g., based on a peak magnitude of the coefficients among frequency bins or on the magnitude of the coefficient of the corresponding frequency bin). The adaptive filter calculates the coefficients based on frequency domain input and error signals, dynamically adjusts a frequency domain coefficient magnitude limit parameter based on the calculated frequency domain coefficients (e.g., approximately proportionally to a peak magnitude of the coefficients among frequency bins) and uses the dynamically adjusted frequency domain coefficient magnitude limit parameter to limit a magnitude of the calculated frequency domain coefficients. The limit may be engaged above a frequency bin based on the peak magnitude frequency bin. An ANC system may employ the filter.

24 Claims, 12 Drawing Sheets

(56) References Cited

OTHER PUBLICATIONS

Wu, Ming et al. "An Improved Active Noise Control Algorithm Without Secondary Path Identification Based on the Frequency-Domain Subband Architecture." IEEE Transactions on Audio, Speech, and Language Processing. vol. 16, No. 8, Nov. 2008. pp. 1409-1419.
Morgan, Dennis R. et al. "A Delayless Subband Adaptive Filter Architecture." IEEE Transactions on Signal Processing, vol. 43, No. 8. Aug. 1995. pp. 1819-1820.
Park, Seon Joon et al. "A Delayless Subband Active Noise Control System for Wideband Noise Control." IEEE Transactions on Speech and Audio Processing. vol. 9, No. 8. Nov. 2001. pp. 892-899.
Yang, Feiran et al. "Frequency-Domain Filtered-x LMS Algorithms for Active Noise Control: A Review and New Insights." Applied Science vol. 8, Nov. 20, 2018. pp. 1-20.

\* cited by examiner

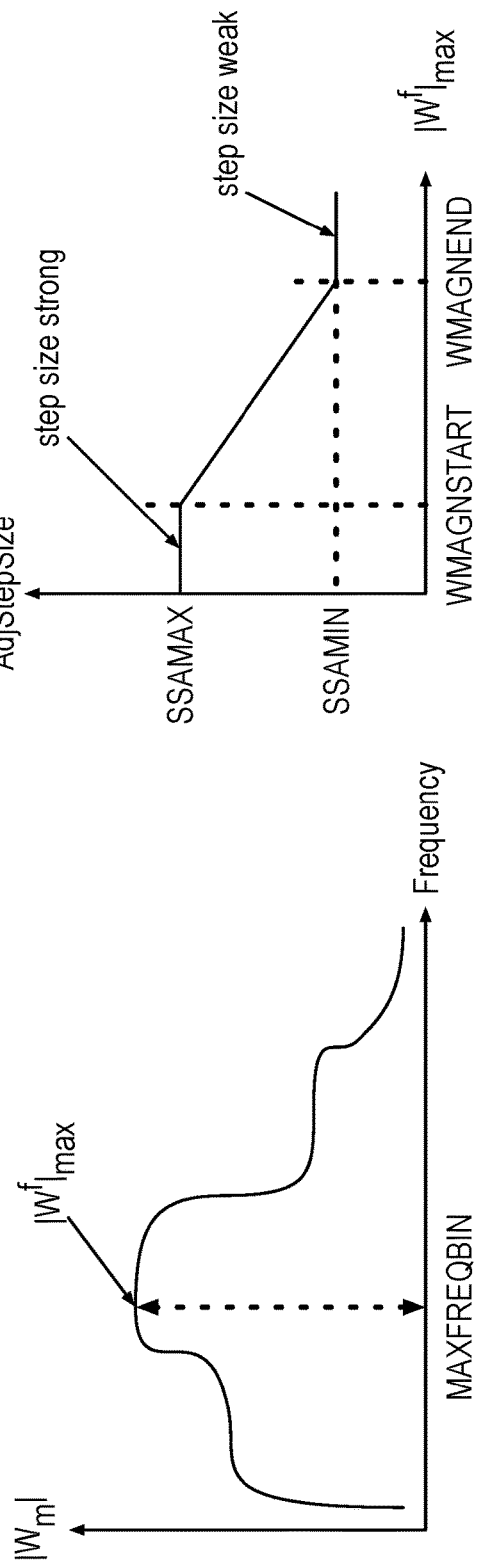
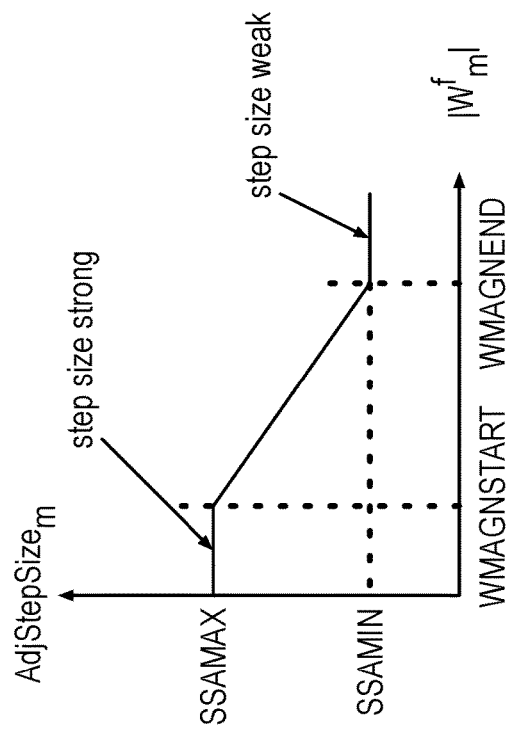
FIG. 5A
FIG. 5B

FREQUENCY DOMAIN COEFFICIENT-BASED DYNAMIC ADAPTATION CONTROL OF ADAPTIVE FILTER

BACKGROUND

An adaptive filter iteratively models the relationship between two signals in real time. Generally, an adaptive filter receives an input signal and computes an output signal based on the input signal. The adaptive filter includes parameters that may be iteratively changed to alter the input-output relationship of the filter. The output signal is compared to a desired response signal by subtracting the output signal from the desired response signal to produce an error signal. The error signal is used to adapt the filter parameters over time according to an adaptation algorithm. The goal of the adaptation algorithm is for the output signal of the filter to eventually more closely match the desired response signal, as indicated by a decrease in the power of the error signal.

Adaptive filters may be employed in a variety of applications. For example, an adaptive filter may be employed to model the effects of a transmission channel that distorts transmitted symbols (e.g., inter-symbol interference) in order to aid in detecting the symbols at the receiver. For another example, an adaptive filter may be employed to model the transfer function of a plant so that a suitable control signal may be calculated and applied to control the plant. For another example, an adaptive filter may be employed to cancel echoes in long distance transmissions such as telephone networks, or to cancel acoustic echoes for conference-style speakerphones. For another example, an adaptive filter may be employed to perform adaptive noise cancelling, such as to cancel a stronger maternal heartbeat in an electroencephalogram (EEG) in order to enable extraction of the weaker heartbeat of an unborn child. For another example, an adaptive filter may be employed to perform channel equalization, such as for use in a modem or wireless telecommunication system. For another example, an adaptive filter may be employed to perform linear predictive coding (LPC), such as for use in modeling signal correlations for a short block of data to reduce the number of bits needed to represent a signal waveform, such as a speech signal. For another example, an adaptive filter may be employed to separate a broadband signal and a nearly periodic signal, which is commonly referred to as adaptive line enhancement. For another example, an adaptive filter may be employed to perform active noise cancellation to cancel ambient noise, such as during use of a mobile phone or headset.

Generally speaking, a filter includes filter coefficients. In the case of a finite impulse response (FIR) filter, for example, the filter coefficients are multiplied by corresponding samples of the input signal and the resulting products are summed to produce the output signal. In the case of an adaptive filter, the coefficients are updated from time to time. In the case of a time domain adaptive filter, time domain samples of the error signal and the input signal are used to update the filter coefficients according to an adaptive algorithm, e.g., least-mean-square (LMS). In the case of a frequency domain adaptive filter, the adaptive filter coefficients are updated in the frequency domain rather than in the time domain. That is, filter coefficients that correspond to frequency bins are maintained. Blocks of the time domain error and input signals are transformed to the frequency domain. The adaptive algorithm uses the frequency domain component of the error and input signal associated with a frequency bin to update the filter coefficient for the frequency bin. The frequency domain coefficients can then be transformed back to the time domain and applied to the time domain input signal. Alternatively, the frequency domain coefficients can be applied to a frequency domain version of the input signal.

As the output signal of an adaptive filter more closely matches the desired response signal as indicated by a decrease in the error signal power, the adaptive filter is said to converge. It is desirable for an adaptive filter, including a frequency domain adaptive filter, to converge quickly. For example, in a noise cancellation application, it is desirable for the adaptive filter to converge as quickly as possible in order to cancel the noise as quickly as possible. However, it is also possible for an adaptive filter to diverge and become unstable as the coefficients become too large. Controlling the stability of an adaptive filter whose adaptation is performed in the frequency domain may be a significant challenge, particularly in applications that have a large dynamic range of input signal in the frequency domain, e.g., audio applications that involve speech and/or music, among others.

SUMMARY

In one embodiment, the present disclosure provides an adaptive filter that includes a digital signal processor programmed to calculate frequency domain coefficients of the adaptive filter that has a leakage/step size parameter that controls adaptation of the adaptive filter and to dynamically adjust the leakage/step size parameter in the frequency domain based on the calculated frequency domain coefficients of the adaptive filter.

In another embodiment, the present disclosure provides a method that includes calculating frequency domain coefficients of an adaptive filter that has a leakage/step size parameter that controls adaptation of the adaptive filter, and dynamically adjusting the leakage/step size parameter in the frequency domain based on the calculated frequency domain coefficients of the adaptive filter.

In yet another embodiment, the present disclosure provides an adaptive filter that includes a digital signal processor programmed to calculate frequency domain coefficients of the adaptive filter based on frequency domain input and error signals, to dynamically adjust a frequency domain coefficient magnitude limit parameter based on the calculated frequency domain coefficients, and to use the dynamically adjusted frequency domain coefficient magnitude limit parameter to limit a magnitude of the calculated frequency domain coefficients.

In yet another embodiment, the present disclosure provides a method that includes calculating frequency domain coefficients of an adaptive filter based on frequency domain input and error signals, dynamically adjusting a frequency domain coefficient magnitude limit parameter based on the calculated frequency domain coefficients, and using the dynamically adjusted frequency domain coefficient magnitude limit parameter to limit a magnitude of the calculated frequency domain coefficients.

based on frequency domain coefficients of the adaptive filter in accordance with embodiments of the present disclosure.

Figure 2:
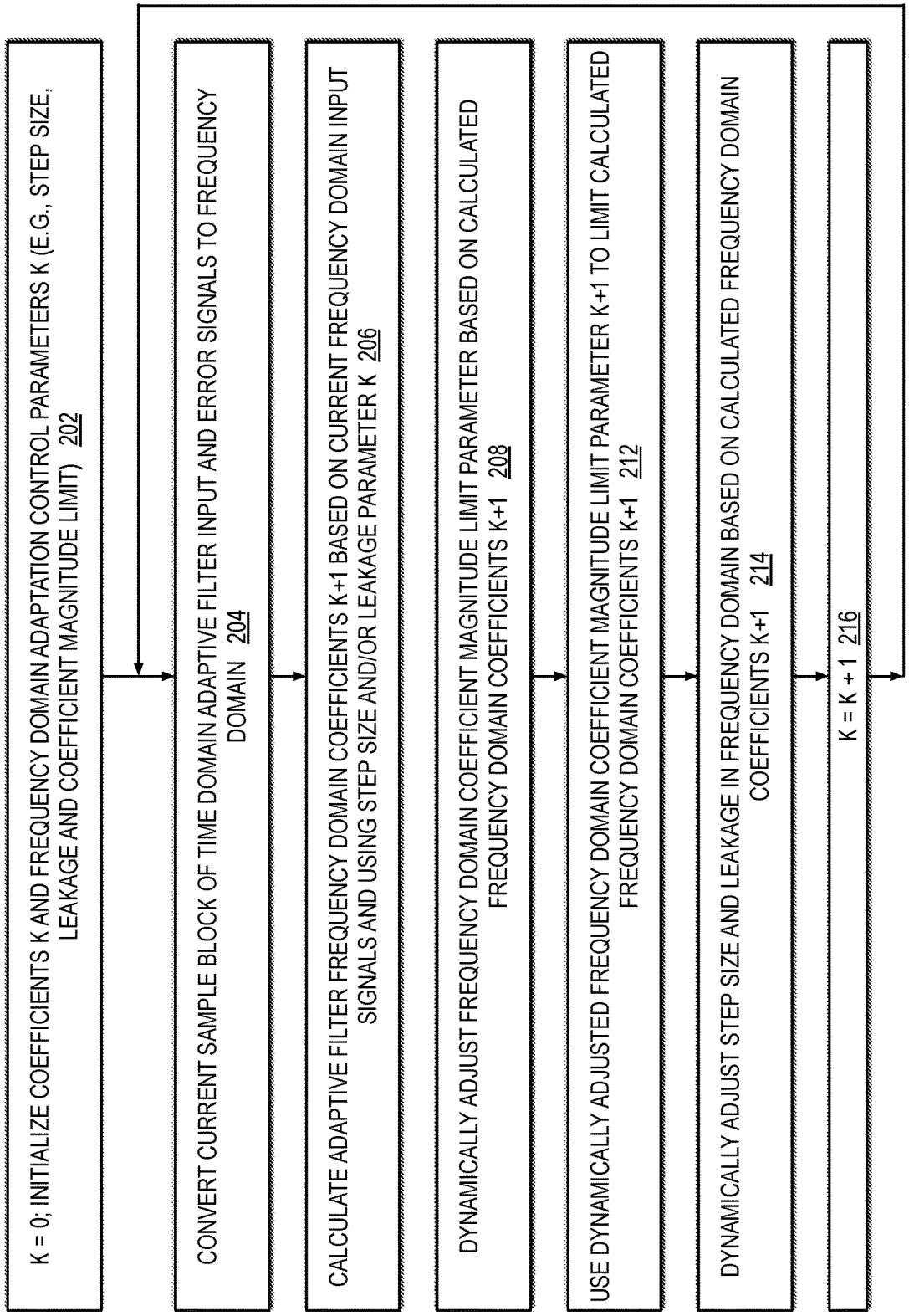

FIG. 2 is an example diagram illustrating operation of a frequency domain coefficient adaptation block of an adaptive filter to adjust stability control parameters (e.g., frequency domain step size, leakage, coefficient magnitude limit) based on frequency domain coefficients of the adaptive filter in accordance with embodiments of the present disclosure.

Figure 3:
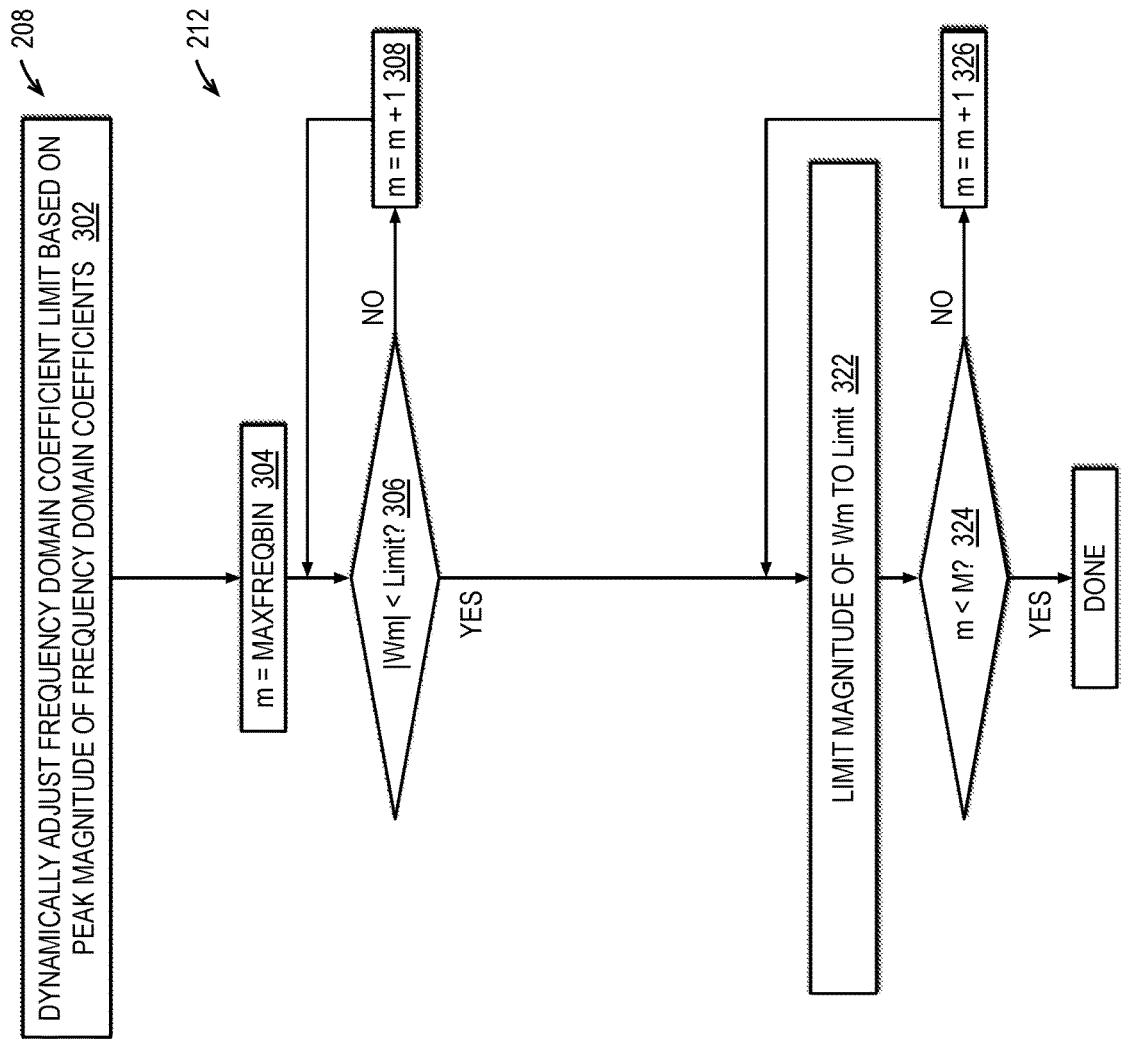

FIG. 3 is an example a diagram illustrating operation of a frequency domain coefficient limiter of an adaptive filter to dynamically adjust a frequency domain coefficient magnitude limit based on frequency domain coefficients of the adaptive filter in accordance with embodiments of the present disclosure.

Figure 4:
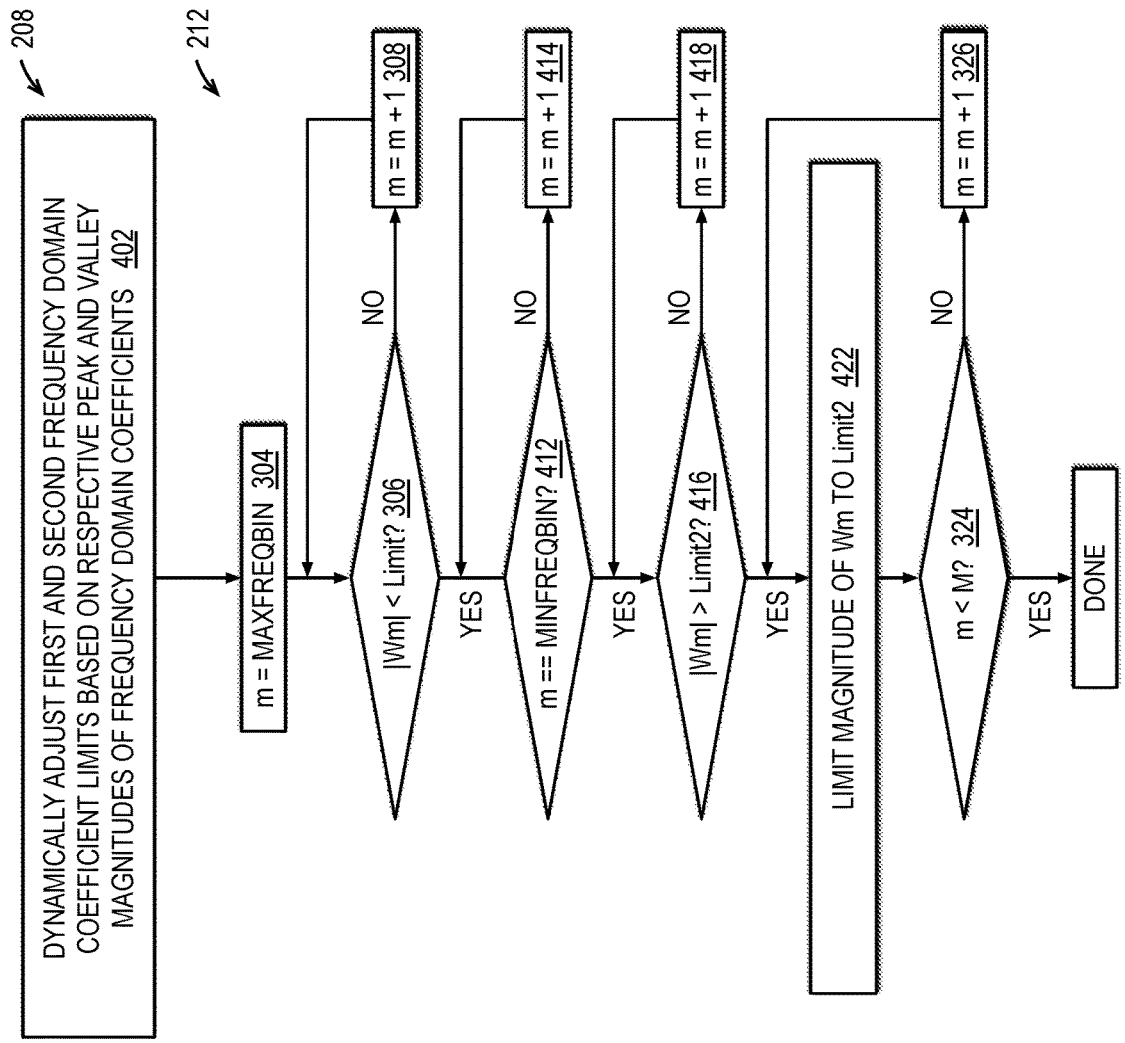

FIG. 4 is an example a diagram illustrating operation of a frequency domain coefficient limiter of an adaptive filter to dynamically adjust a frequency domain coefficient magnitude limit based on frequency domain coefficients of the adaptive filter in accordance with an alternate embodiment of the present disclosure.

FIG. 5A is an example of a pair of graphs illustrating determination of a non-frequency bin-specific step size adjustment factor based on a peak frequency domain coefficient magnitude in accordance with an alternate embodiment of the present disclosure.

FIG. 5B is an example of a graph illustrating determination of step size adjustment factors based on frequency bin-specific coefficient magnitudes in accordance with an alternate embodiment of the present disclosure.

Figure 6A:
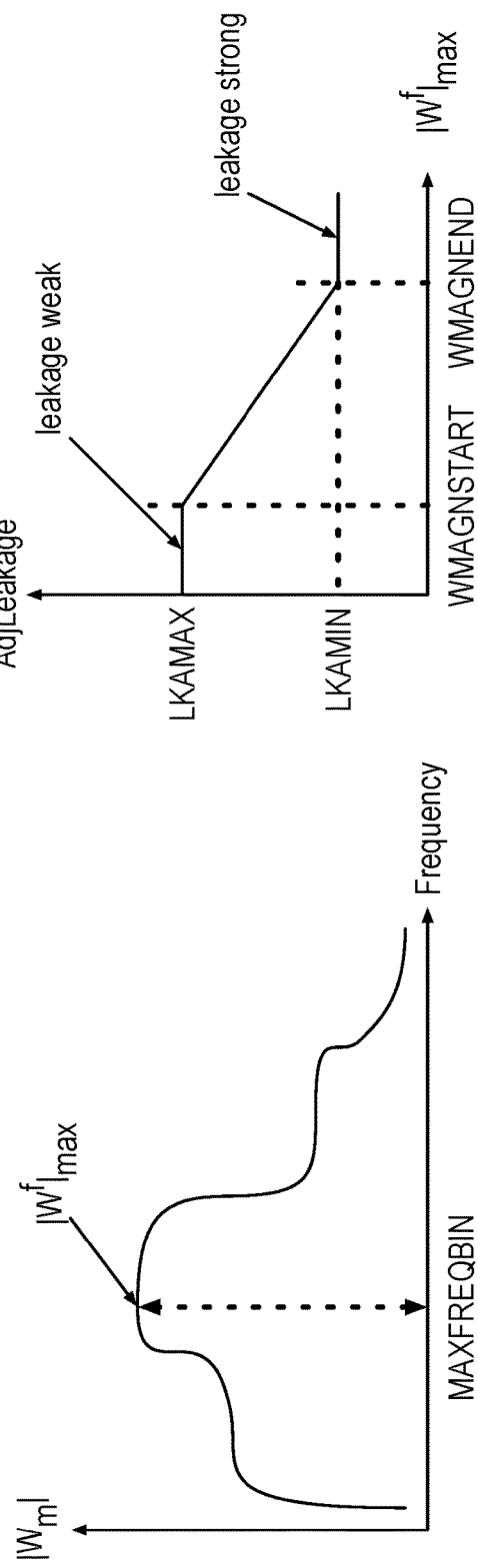

FIG. 6A is an example of a pair of graphs illustrating determination of a non-frequency bin-specific leakage adjustment factor based on a peak frequency domain coefficient magnitude in accordance with an alternate embodiment of the present disclosure.

Figure 6B:
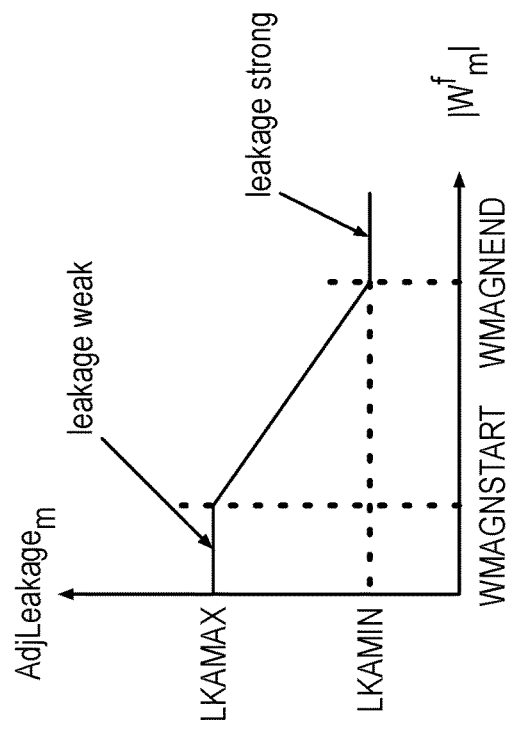

FIG. 6B is an example of a graph illustrating determination of leakage adjustment factors based on frequency bin-specific coefficient magnitudes in accordance with an alternate embodiment of the present disclosure.

Figure 7A:
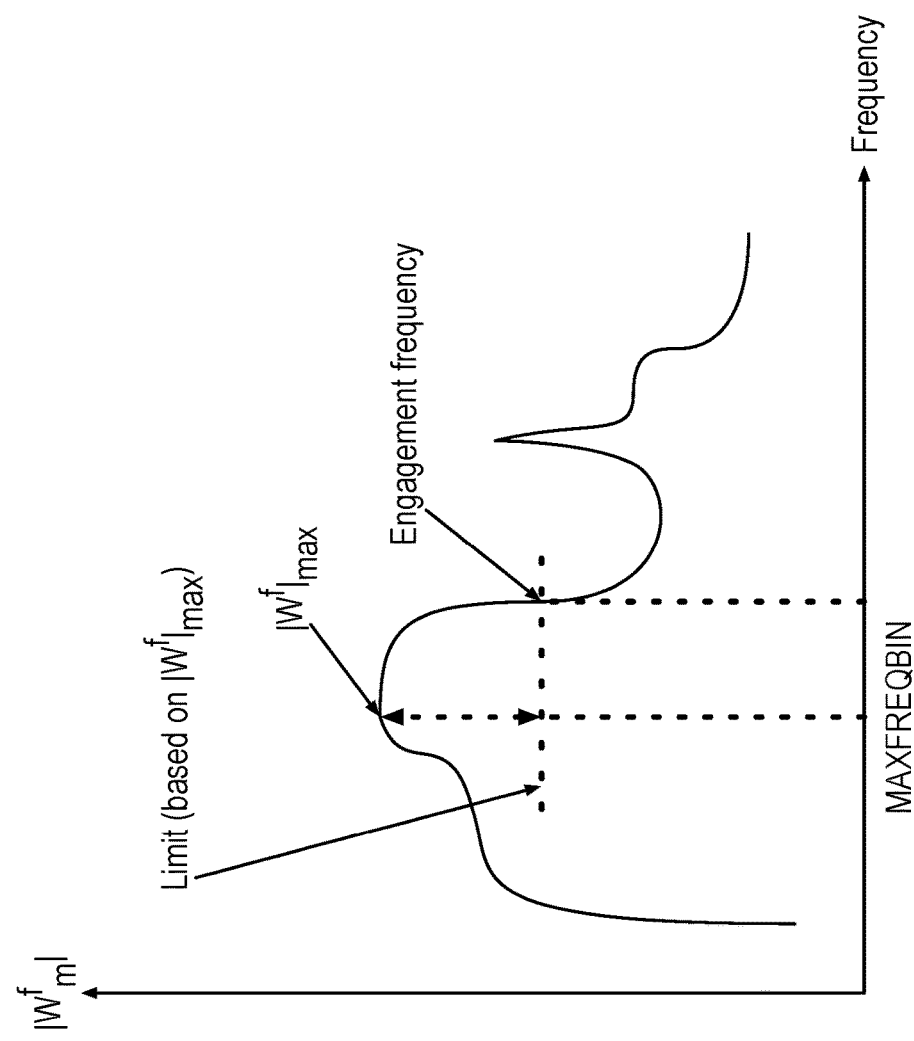

FIG. 7A is an example of a graph illustrating determination of a coefficient magnitude limit based on a peak frequency domain coefficient magnitude in accordance with an alternate embodiment of the present disclosure.

Figure 7B:
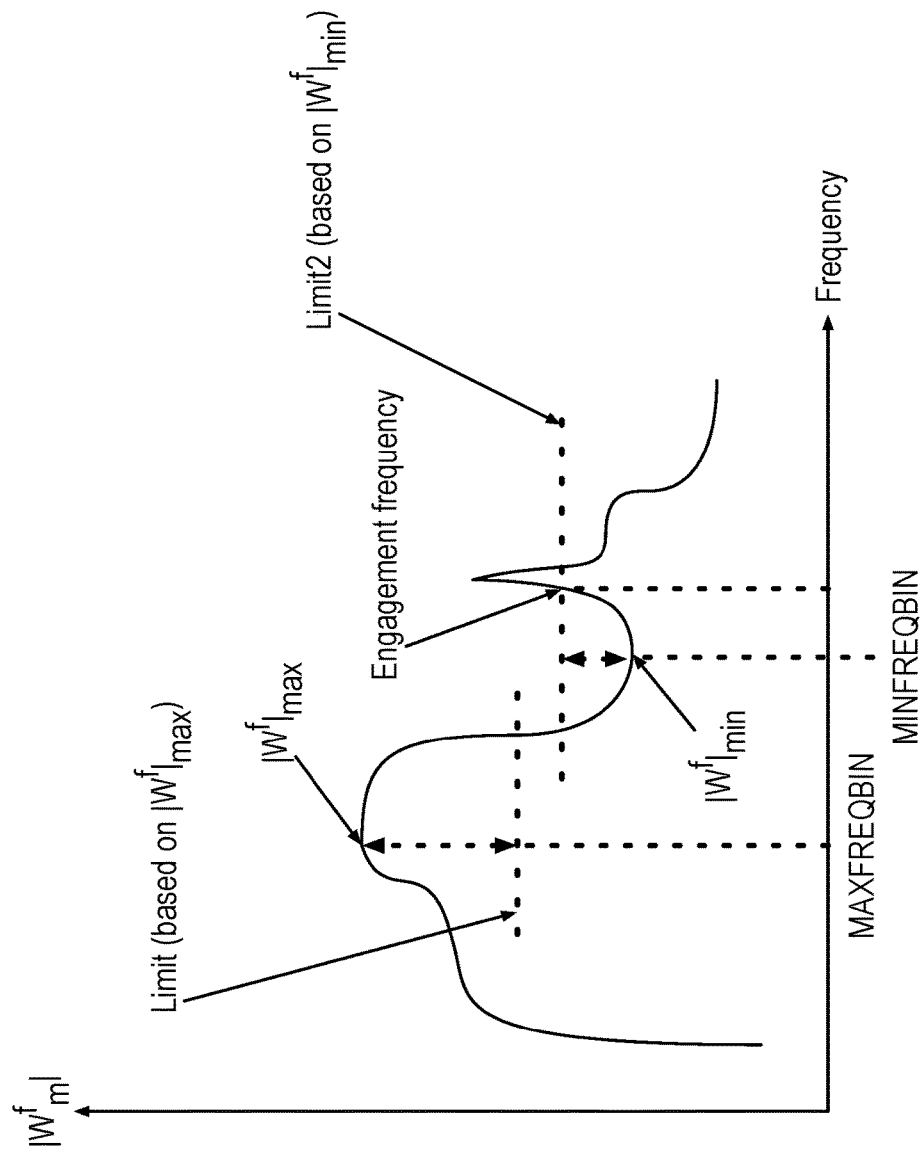

FIG. 7B is an example of a graph illustrating determination of a pair of coefficient magnitude limits based on peak and valley frequency domain coefficient magnitudes in accordance with an alternate embodiment of the present disclosure.

Figure 8A:
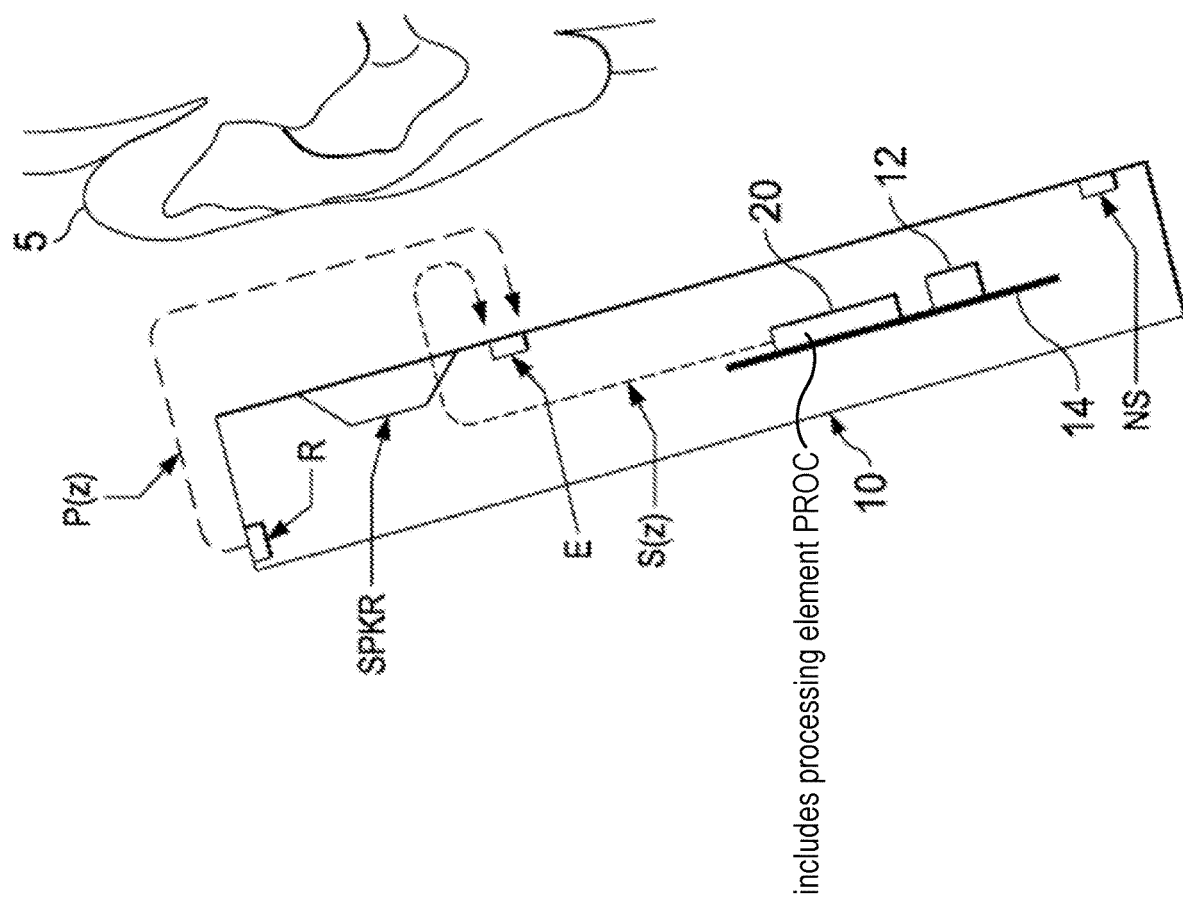

FIG. 8A is an example wireless telephone in accordance with embodiments of the present disclosure shown in proximity to a human ear.

Figure 8B:
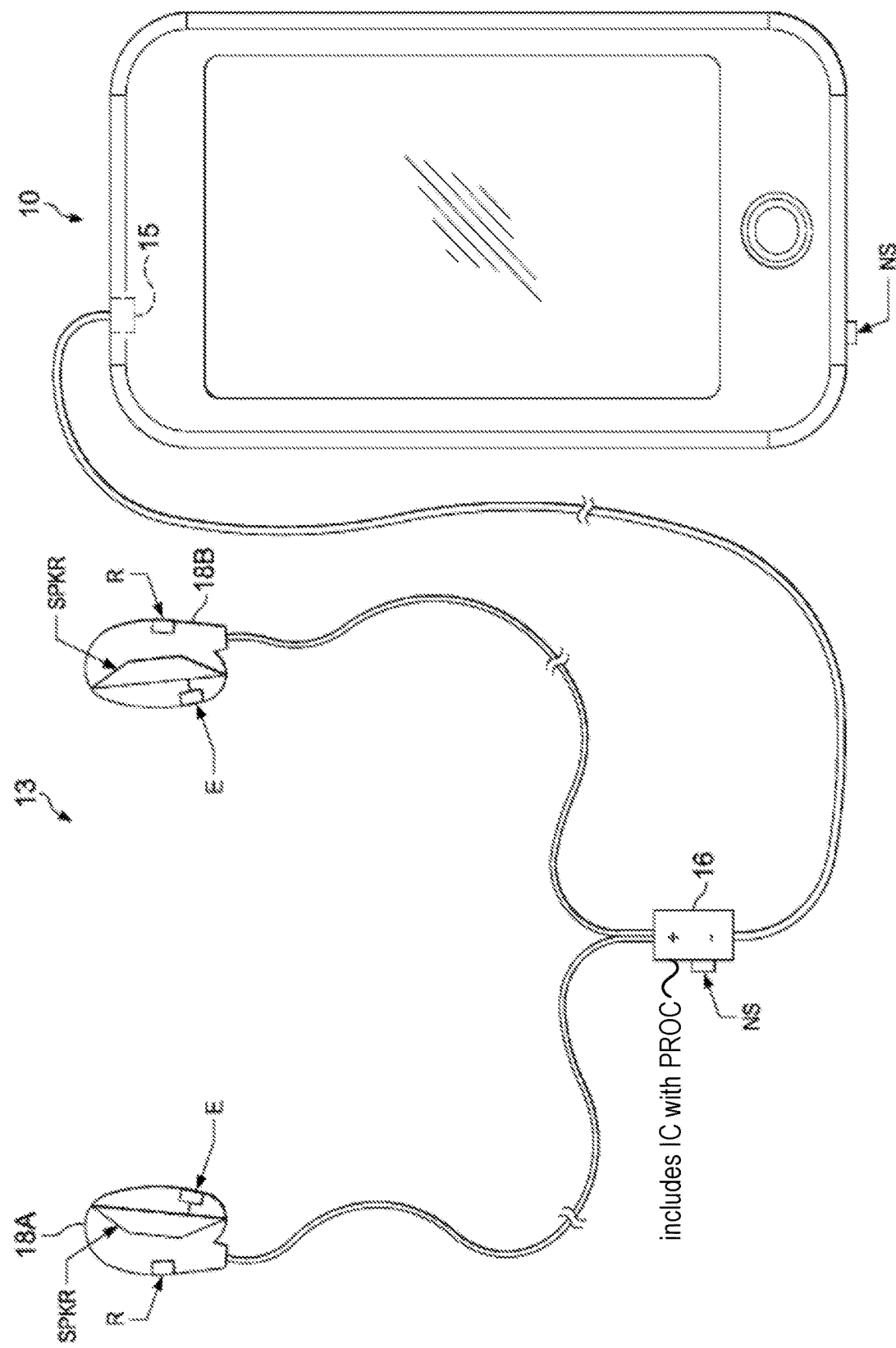

FIG. 8B is an example wireless telephone having a headset assembly coupled to it via audio port in accordance with embodiments of the present disclosure.

Figure 1:
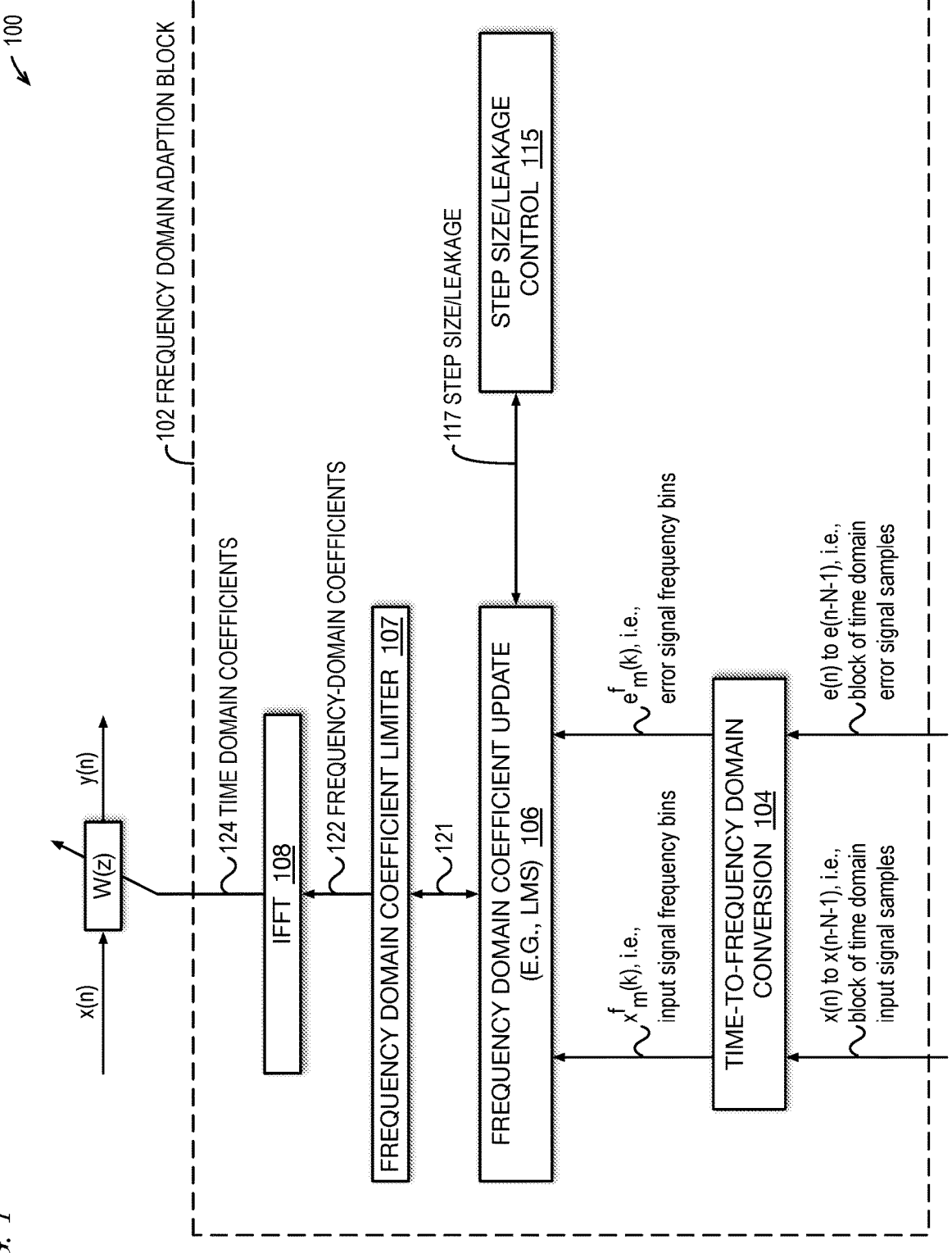
FIG. 1 is an example block diagram of an adaptive filter that includes a frequency domain coefficient adaptation block that dynamically adjusts stability control parameters (e.g., frequency domain step size, leakage, coefficient limit)
Figure 9:
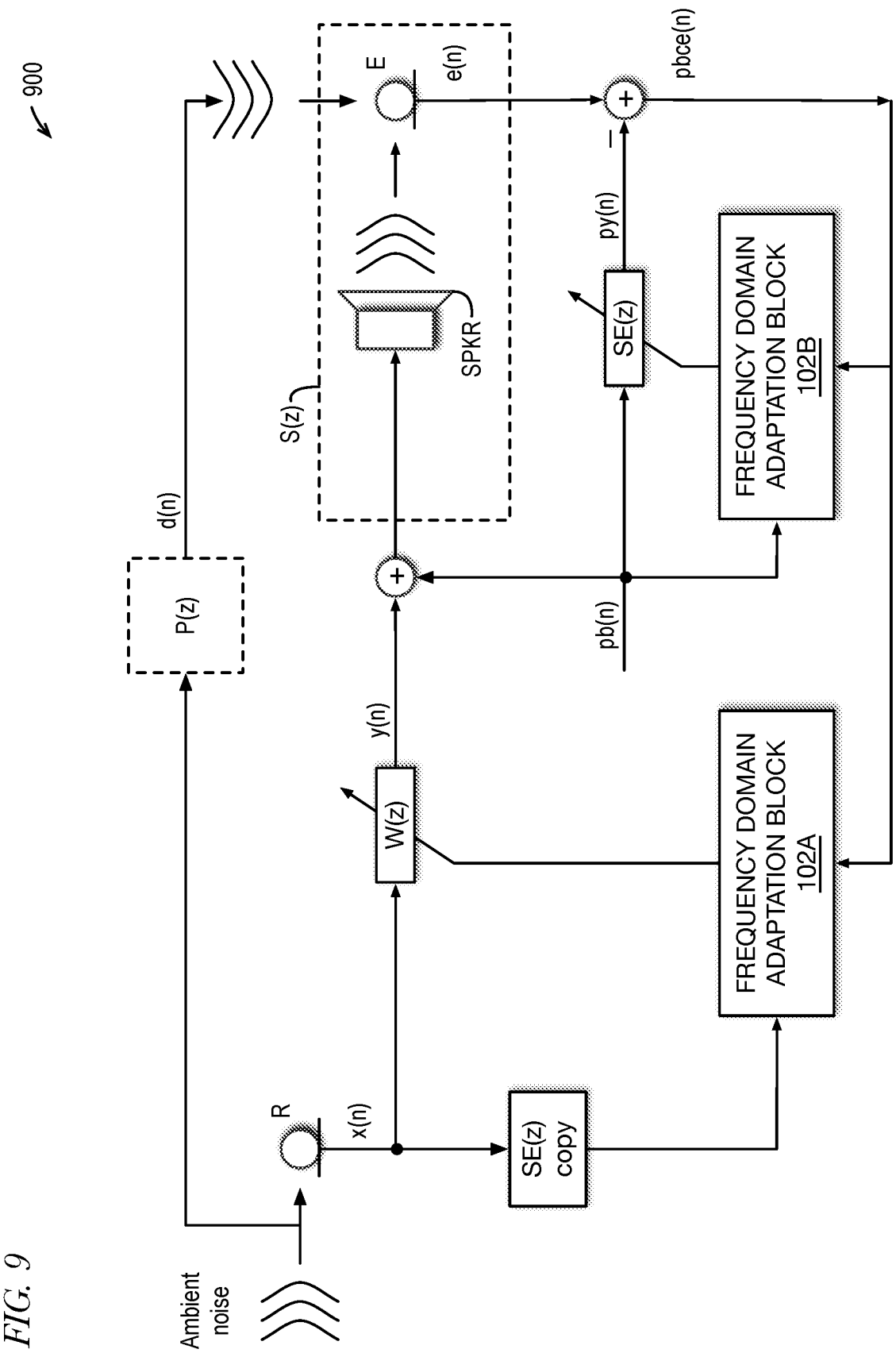

FIG. 9 is an example block diagram of an ANC system that includes frequency domain adaptation blocks that perform frequency domain coefficient-based dynamic adaptation control of adaptive filters each of which may be an instance of the adaptive filter of FIG. 1 in accordance with an alternate embodiment of the present disclosure.

Figure 10:
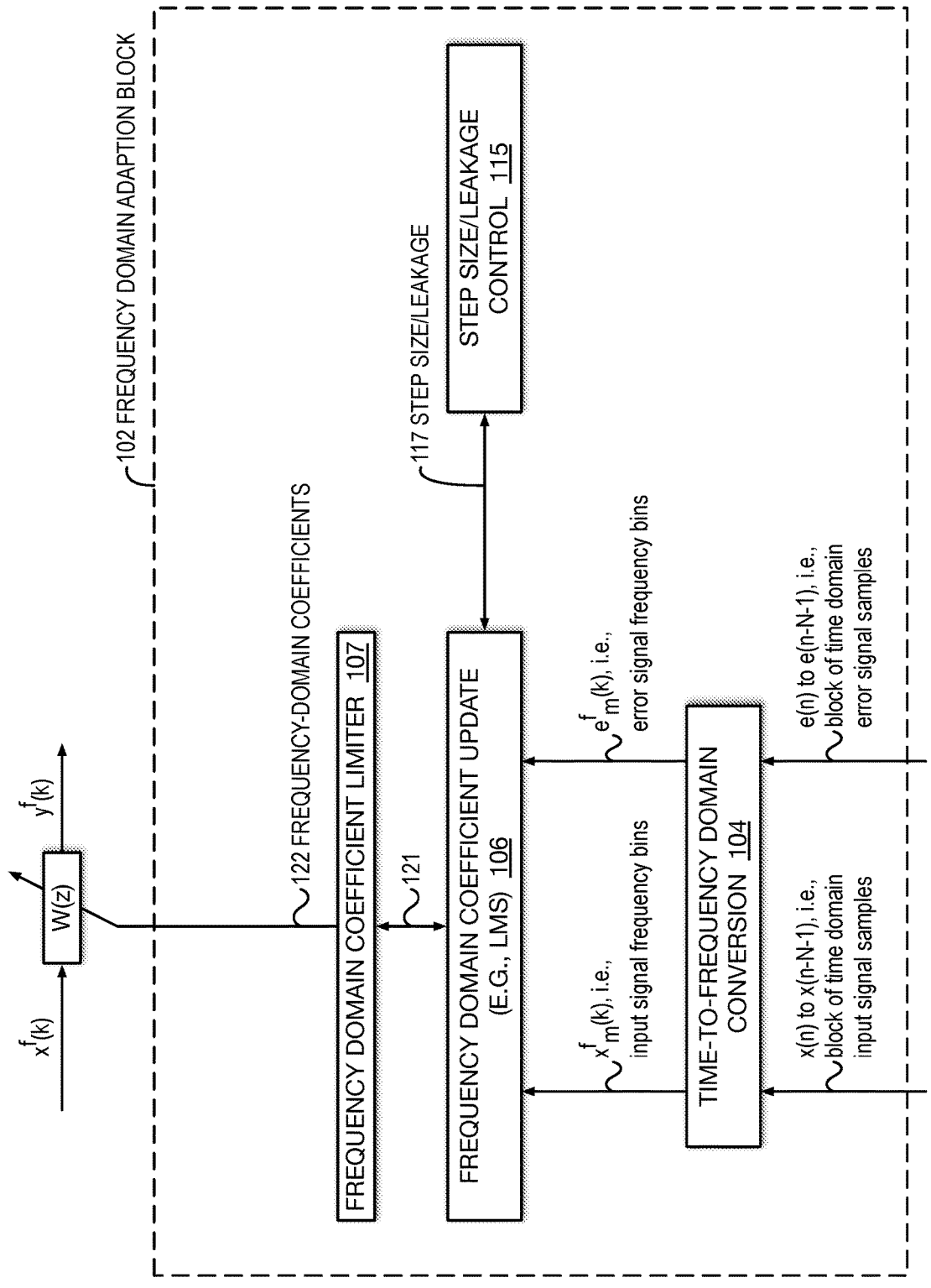

FIG. 10 is an example block diagram of an adaptive filter that includes a frequency domain coefficient adaptation block that performs frequency domain coefficient-based dynamic adaptation control of adaptive filter in accordance with an alternate embodiment of the present disclosure.

DETAILED DESCRIPTION

When an adaptive filter becomes unstable, its output signal may become undesirable, e.g., its level and/or levels of individual frequency components of the output signal may be too large. For example, in an audio system that employs active noise cancellation (ANC), an adaptive filter may model, or identify, an acoustic path of the system, e.g., between a reference microphone and an error microphone, to generate an anti-noise output signal. The acoustic path may change because the listener moves the audio device to a different position relative to the ear, for example, or places fingers on the device between the microphones. The adaptive filter may become unstable as it attempts to adapt in response to the change in the acoustic path, e.g., the anti-noise output signal may include undesirable components. Conventional approaches to coping with the effects of an adaptive filter becoming unstable may involve using other elements of the system taking the output signal from the adaptive filter and curbing it in some fashion in order to make the system as a whole, rather than the filter itself, stable.

Embodiments are described in which the filter itself is observed and stability control is applied to the adaptation of the filter based on the observation of the filter. More specifically, dynamic adjustment of step size/leakage parameters and/or a frequency domain filter coefficient magnitude limitation parameter are applied directly in the filter adaptation process of frequency domain coefficient update. The approach of dynamically adjusting the step size, leakage and/or coefficient magnitude limit parameters has the advantage of being effective in controlling the stability of the adaptive filter and of being faster to apply than conventional methods.

FIG. 1 is an example block diagram of an adaptive filter 100 that includes a frequency domain coefficient adaptation block 102 that dynamically adjusts stability control parameters (e.g., frequency domain step size, leakage, coefficient limit) based on frequency domain coefficients of the adaptive filter in accordance with embodiments of the present disclosure. The adaptive filter 100 includes a time domain filter W(z) that receives an input signal x(n) and time domain filter coefficients 124 from the frequency domain adaptation block 102. For each time frame n, the time domain filter W(z) applies the time domain filter coefficients 124 to the input signal x(n) to produce an output signal y(n).

The frequency domain adaptation block 102 includes a time-to-frequency domain conversion block 104, a frequency domain coefficient update block 106, a frequency domain coefficient limiter block 107, an inverse fast Fourier transform (IFFT) block 108, and a step size/leakage control block 115. The time-to-frequency domain conversion block 104 converts a block of N time domain input signal samples x(n) to x(n−N−1) (e.g., N=512 or 1024) into a frequency domain input signal $x_m^f(k)$, where m is a frequency bin index of M frequency bins (e.g., M=512 or 1024), and k is a sample block index. The time-to-frequency domain conversion block 104 also converts a block of N time domain error signal samples e(n) to e(n−N−1) into a frequency domain error signal $e_m^f(k)$. The frequency domain input signal $x_m^f(k)$ and the frequency domain error signal $e_m^f(k)$ are received by the frequency domain coefficient update block 106. In one embodiment, the time-to-frequency domain conversion block 104 includes blocks to perform polyphase filtering of the input and error signals.

The frequency domain coefficient update block 106 uses the frequency domain input signal $x_m^f(k)$ and frequency domain error signal $e_m^f(k)$, along with one or more step sizes/leakages 117 generated by the step size/leakage control block 115 to generate updated intermediate frequency domain coefficients 121. As described in more detail below, in one embodiment the frequency domain coefficient update block 106 receives M step sizes/leakages 117 associated with the M frequency bins. In one embodiment, the step size/leakage control block 115 accesses frequency domain coefficients of the frequency domain coefficient update block 106 in order to generate the step sizes/leakages 117. The intermediate frequency domain coefficients 121 are then selectively limited by the frequency domain coefficient limiter block 107 to generate frequency domain coefficients 122, as described in more detail below. The IFFT block 108 converts the frequency domain coefficients 122 to the time domain coefficients 124 provided to the time domain filter W(z).

Equation (1) expresses a normalized LMS adaptation algorithm, for computing a frequency domain filter coefficient of a next sample block k+1 for a frequency bin m $$w_m^f(k+1) = \lambda_m w_m^f(k) + \mu_m \frac{x_m^{f*}(k)e_m^f(k)}{|x_m^f(k)||x_m^f(k)|_{max}} \quad (1)$$

where $\lambda_m$ is a leakage parameter for frequency bin m, $w_m^f(k)$ is the frequency domain filter coefficient of current sample block k for frequency bin m, $\mu_m$ is the step size for frequency bin m, $x_m^{f*}(k)$ is the complex conjugate of the frequency domain input signal of current sample block k for frequency bin m, $e_m^f(k)$ is the frequency domain error signal of current sample block k for frequency bin m, $|x_m^f(k)|$ is the magnitude of the frequency domain input signal of current sample block k for frequency bin m, and $|x_m^f(k)|_{max}$ is the magnitude of the maximum value of the frequency domain input signal for all the frequency bins of current sample block k. In one embodiment, $|x_m^f(k)|_{max}$ may be replaced with $|x_m^f(k)|$ in the denominator. Preferably, the frequency domain input signal $x_m^f(k)$ and the frequency domain error signal $e_m^f(k)$ are complex values.

As may be seen from equation (1), the step size and leakage are parameters of an adaptive filter that affect the speed at which an adaptive filter converges. It is desirable for an adaptive filter to converge as quickly as possible. Generally speaking, an adaptive filter is capable of converging faster if the step size is relatively large. However, under some conditions, a relatively large step size may also pose a danger of causing the adaptive filter to diverge, i.e., causing the coefficients to become too large. Embodiments are described in which the step size is dynamically adjusted based on the dynamically adapted values of the frequency domain coefficients themselves. More specifically, the step size is made stronger or weaker in proportion to the magnitude of the frequency domain coefficients. In one embodiment, the peak magnitude of the coefficients among the frequency bins is used to dynamically adjust the step size. In another embodiment, the coefficient magnitude of each frequency bin is used to adjust the corresponding step size for the frequency bin. The dynamic adjustment of the step size based on frequency domain coefficient magnitude, i.e., on the adaptive filter itself (e.g., rather than on, or in addition to, aspects of the system that employs the filter, e.g., signals), is advantageous because it may provide more adaptation stability for the adaptive filter, particularly when the adaptive filter may vary widely. For example, in the case of an adaptive filter that identifies an acoustic transfer function between microphones of an audio device, the transfer function may vary greatly depending upon the location of the listener's ear or hand relative to the audio device. Furthermore, by adjusting the step size directly based on the magnitude of the frequency domain coefficient, the dynamic adjustment is fast and effective.

Equation (2) expresses a method for computing a frequency domain filter coefficient for a frequency bin m of a next sample block k+1, but in a manner that adjusts the step size over each sample block and for each frequency bin.

$$w_m^f(k+1) = \lambda_m w_m^f(k) + AdjStepSize_m(k)\mu_m \frac{x_m^{f*}(k)e_m^f(k)}{|x_m^f(k)||x_m^f(k)|_{max}} \quad (2)$$

Equation (2) is similar to equation (1); however, the default step size um of frequency bin m is multiplied by a sample block-specific adjustment factor $AdjStepSize_m(k)$ for the frequency bin m which is computed by the step size/leakage control block 115 (e.g., according to equation (3) or (4) below). In one embodiment, the default step size $\mu_m$ is a tunable parameter and, advantageously, the user may select a relatively larger value than without the dynamic step size adjustment embodiments described herein because the embodiments may adjust the step size downward as needed. In other embodiments, the complex conjugate of the error signal rather than of the input signal may be employed to compute the coefficient for the next sample block.

The step size/leakage control block 115 accesses frequency domain coefficients of the frequency domain coefficient update block 106 to compute the new step sizes/leakages 117. The step size/leakage control block 115 computes the adjustment factors $AdjStepSize_m(k)$ and uses them to dynamically adjust the step sizes 117 associated with the M frequency bins for provision to the frequency domain coefficient update block 106 for use in updating the intermediate frequency domain coefficients 121, embodiments of which are described below.

As an example, in one embodiment, the sample block-specific and frequency bin-specific adjustment factor $AdjStepSize_m(k)$ is expressed in equation (3), which is graphically depicted in FIG. 5B.

$$AdjStepSize_m^f(k+1) = \quad (3)$$
$$\begin{cases} SSAMAX; & \text{when } |w_m^f(k+1)| < WMAGNSTART \\ SSAMIN; & \text{when } |w_m^f(k+1)| > WMAGNEND \\ SLOPE*(|w_m^f(k+1)| - & \text{otherwise} \\ WMAGNSTART) + SSAMIN; & \end{cases}$$

SLOPE = (SSAMAX − SSAMIN) / (WMAGSTART − WMAGEND)

As another example, in one embodiment, the sample block-specific and non-frequency bin-specific adjustment factor AdjStepSize(k) is expressed in equation (4), which is graphically depicted on the right side of FIG. 5A.

$$AdjStepSize^f(k+1) = \quad (4)$$
$$\begin{cases} SSAMAX; & \text{when } |w^f(k+1)|_{max} < WMAGNSTART \\ SSAMIN; & \text{when } |w^f(k+1)|_{max} > WMAGNEND \\ SLOPE*(|w^f(k+1)|_{max} - & \text{otherwise} \\ WMAGNSTART) + SSAMIN; & \end{cases}$$

SLOPE = (SSAMAX − SSAMIN) / (WMAGSTART − WMAGEND)

The leakage parameter $\mu_m$ of equation (1) may also affect the speed of convergence of an adaptive filter and is generally employed to increase the stability of the adaptive filter by preventing unbounded growth of its coefficients. The leakage parameter $\lambda_m$ value is typically chosen between zero and one, typically closer to one. Equation (5) expresses a method for computing a frequency domain filter coefficient for a frequency bin m of a next sample block k+1, but in a manner that adjusts the leakage over each sample block and for each frequency bin. The dynamic adjustment of the leakage parameter based on coefficient magnitude, i.e., on the adaptive filter itself (e.g., rather than relying on other elements of the system than the adaptive filter), may be advantageous because it may provide more adaptation stability for the adaptive filter.

$$w_m^f(k+1) = AdjLeakage_m(k)\lambda_m w_m^f(k) + \mu_m \frac{x_m^{f*}(k)e_m^f(k)}{|x_m^f(k)||x_m^f(k)|_{max}} \quad (5)$$

Equation (5) is similar to equation (2); however, the default leakage $\lambda_m$ of frequency bin m is multiplied by a sample block-specific adjustment factor $AdjLeakage_m(k)$ for the frequency bin m which is computed by the step size/leakage control block 115 (e.g., according to equation (6) or (7) below). In one embodiment, the default leakage $\lambda_m$ is a tunable parameter the user may select. In other embodiments, the complex conjugate of the error signal rather than the input signal may be employed to compute the coefficient for the next sample block.

The step size/leakage control block 115 accesses frequency domain coefficients of the frequency domain coefficient update block 106 to compute the new leakages 117. The step size/leakage control block 115 computes the adjustment factors $AdjLeakage_m(k)$ and uses them to dynamically adjust the leakages 117 associated with the M frequency bins for provision to the frequency domain coefficient update block 106 for use in updating the intermediate frequency domain coefficients 121, embodiments of which are described below.

As an example, in one embodiment, the sample block-specific and frequency bin-specific adjustment factor $AdjLeakage_m(k)$ is expressed in equation (6), which is graphically depicted in FIG. 6B.

$$AdjLeakage_m^f(k+1) = \quad (6)$$

$$\begin{cases} LKAMAX; & \text{when } |w_m^f(k+1)| < WMAGNSTART \\ LKAMIN; & \text{when } |w_m^f(k+1)| > WMAGNEND \\ SLOPE*(|w_m^f(k+1)| - \\ WMAGNSTART) + LKAMIN; & \text{otherwise} \end{cases}$$

$$SLOPE = (LKAMAX - LKAMIN)/(WMAGSTART - WMAGEND)$$

As another example, in one embodiment, the sample block-specific and non-frequency bin-specific adjustment factor AdjLeakage(k) is expressed in equation (7), which is graphically depicted on the right side of FIG. 6A.

$$AdjLeakage^f(k+1) = \quad (7)$$

$$\begin{cases} LKAMAX; & \text{when } |w^f(k+1)|_{max} < WMAGNSTART \\ LKAMIN; & \text{when } |w^f(k+1)|_{max} > WMAGNEND \\ SLOPE*(|w^f(k+1)|_{max} - \\ WMAGNSTART) + LKAMIN; & \text{otherwise} \end{cases}$$

$$SLOPE = (LKAMAX - LKAMIN)/(WMAGSTART - WMAGEND)$$

When the frequency domain coefficient update block 106 generates the intermediate frequency domain coefficients 121, the frequency domain coefficient limiter 107 applies a gain constraint on the updated intermediate frequency domain coefficients 121 to generate the frequency domain coefficients 122 that are provided to the IFFT 108. In one embodiment, the frequency domain coefficient limiter 107 applies the gain constraint as shown in equation (8).

$$w_m^f(k+1) = \begin{cases} w_m^f(k+1); & \text{when } |w_m^f(k+1)| < Limit^f \\ \frac{w_m^f(k+1)}{|w_m^f(k+1)|} Limit^f; & \text{when } |w_m^f(k+1)| > Limit^f \end{cases} \quad (8)$$

The frequency domain coefficient limiter 107 may be useful for keeping the adaptive filter 100 constrained and for reducing noise boost, particularly at high frequency. However, a fixed, or static, Limit threshold may not always be effective since the system that the adaptive filter is attempting to model or identify may vary over time. For example, an adaptive filter that is employed to model, at least in part, an acoustic path between a reference microphone and an error microphone of a mobile audio device (e.g., to generate an anti-noise signal for actively cancelling noise) may vary significantly from person to person and/or for different device positions. Therefore, embodiments of a dynamic frequency domain coefficient limiter 107 are described. Instead of employing a fixed Limit magnitude value, the Limit magnitude is dynamically scaled based on the frequency response of the adaptive filter itself, e.g., based on the frequency domain coefficients of the adaptive filter 100. In one embodiment, the Limit may be scaled based on the adaptive filter frequency domain coefficient of the frequency bin having the peak magnitude among the frequency bins. In one embodiment, the frequency domain coefficient limiter 107 calculates the Limit according to equation (9)

$$Limit^f(k+1) = |w^f(k+1)|_{max} * G1 \quad (9)$$

where G1 is a tunable scale factor that the user may select.

In one embodiment, the dynamic frequency domain coefficient limiter 107 may only engage in a limited range of frequency bins, e.g., above the frequency when the adaptive filter frequency response dips below the Limit threshold as shown in FIG. 7A and as described with respect to FIG. 3 below. In another embodiment, the dynamic frequency domain coefficient limiter 107 may only engage in a limited range of frequency bins, e.g., above the frequency when the adaptive filter frequency response dips below the Limit threshold, then rises above a second Limit2 threshold, as shown in FIG. 7B and as described with respect to FIG. 4 below. In one embodiment, the frequency domain coefficient limiter 107 calculates the second Limit2 according to equation (10)

$$\text{Limit2}^f(k+1) = |w^f(k+1)|_{min} * G2 \quad (10)$$

where G2 is a tunable scale factor that the user may select.

Although FIG. 1 describes an embodiment in which the adaptive filter 100 is a finite impulse response (FIR) filter, other embodiments are contemplated in which an infinite impulse response (IIR) filter or a lattice filter is employed. In one embodiment, the frequency domain adaptive filter 100 comprises a digital signal processor (DSP) programmed to perform operations of adaptive filter embodiments described herein.

FIG. 2 is a diagram illustrating operation of a frequency domain coefficient adaptation block of an adaptive filter (e.g., frequency domain coefficient adaptation block 102 of adaptive filter 100 of FIG. 1) to adjust stability control parameters (e.g., frequency domain step size, leakage, coefficient magnitude limit) based on frequency domain coefficients of the adaptive filter in accordance with embodiments of the present disclosure. Operation begins at block 202.

At block 202, the adaptive filter initializes a sample block index k to zero. Additionally, a first set of coefficients k of the adaptive filter are initialized, as well as frequency domain adaptation control parameters of the adaptive filter, e.g., step size $\mu_m$, leakage $\lambda_m$, and coefficient magnitude Limit. Operation proceeds to block 204.

At block 204, the adaptive filter (e.g., time-to-frequency domain conversion block 104) converts the current sample k of time domain adaptive filter input and error signals, x(n) through x(n+N−1) and e(n) through e(n+N−1) to the frequency domain, e.g., into frequency domain input signal $x_m^f(k)$ and the frequency domain error signal $e_m^f(k)$ of FIG. 1. Operation proceeds to block 206.

At block 206, the adaptive filter (e.g., frequency domain coefficient update block 106) calculates intermediate frequency domain coefficients of index k+1 (e.g., intermediate frequency domain coefficients 121 of FIG. 1) based on the current frequency domain input and error signals converted at block 204 and using the dynamically adjusted step size and/or leakage parameter at index k, e.g., according to equation (2) or (5) or a combination thereof above (i.e., using both the dynamically adjusted step size and leakage parameter). That is, the index k step size and/or leakage parameter values dynamically adjusted at block 214 below (or, in the case of the first iteration through the operation described in FIG. 2, the step size and/or leakage parameter values initialized at block 202) are used to calculate the index k+1 intermediate frequency domain coefficients. Operation proceeds to block 208.

At block 208, the adaptive filter (e.g., the frequency domain coefficient limiter 107) dynamically adjusts the frequency domain coefficient magnitude Limit parameter based on the index k+1 frequency domain coefficients calculated at block 206, e.g., according to equation (9) above. Operation proceeds to block 212.

At block 212, the adaptive filter (e.g., the frequency domain coefficient limiter 107) uses the frequency domain coefficient magnitude Limit parameter dynamically adjusted at block 208 to limit the index k+1 frequency domain coefficients calculated at block 206, e.g., according to equation (8) above. Operation proceeds to block 214.

At block 214, the adaptive filter (e.g., the step size/leakage control block 115) dynamically adjusts the frequency domain step size and/or leakage based on the index k+1 frequency domain coefficients calculated at block 206, e.g., according to equations (3) or (4) and/or (6) or (7) above. Operation proceeds to block 216.

At block 216, the sample block index k is incremented and the operation returns to block 204 to process the next sample block.

FIG. 3 is a diagram illustrating operation of a frequency domain coefficient limiter of an adaptive filter (e.g., frequency domain coefficient limiter 107 of frequency domain coefficient adaptation block 102 of adaptive filter 100 of FIG. 1) to dynamically adjust a frequency domain coefficient magnitude Limit based on frequency domain coefficients of the adaptive filter (e.g., according to blocks 208 and 212 of FIG. 2) in accordance with embodiments of the present disclosure. Operation begins at block 302.

At block 302, the adaptive filter (e.g., the frequency domain coefficient limiter 107) dynamically adjusts the frequency domain coefficient magnitude Limit parameter based on the peak magnitude of the index k+1 frequency domain coefficients calculated at block 206, e.g., according to equation (9) above, which is at a frequency bin denoted MAXFREQBIN in FIG. 7A. Operation proceeds to block 304.

At block 304, a frequency bin index m is initialized to MAXFREQBIN of FIG. 7A, i.e., the frequency bin having the coefficient with the maximum, or peak, magnitude $|w_m^f(k+1)|_{max}$. Operation proceeds to decision block 306.

At decision block 306, a determination is made whether the magnitude $|w_m^f(k+1)|$ of the coefficient of the current frequency bin m is less than the frequency domain coefficient magnitude Limit threshold to detect the condition that the frequency domain coefficient magnitude, proceeding from lower frequency to higher frequency, has now dropped below the Limit threshold, which is indicated at the Engagement frequency in FIG. 7A. If so, operation proceeds to block 322; otherwise, operation proceeds to block 308.

At block 308, the frequency bin index m is incremented. Operation returns to decision block 306.

At block 322, the magnitude $|w_m^f(k+1)|$ of the coefficient of the current frequency bin m is limited, e.g., according to equation (8) above, since the frequency bin m is beyond the Engagement frequency bin. Operation proceeds to decision block 324.

At decision block 324, a determination is made whether the current frequency bin index m is less than the number of frequency bins M. If so, operation is done. If not, operation proceeds to block 326.

At block 326, the frequency bin index m is incremented. Operation returns to block 322 to selectively limit the magnitude of the coefficient of the next frequency bin.

As may be observed, blocks 304 through 326 effectively perform block 212 of FIG. 2.

FIG. 4 is a diagram illustrating operation of a frequency domain coefficient limiter of an adaptive filter (e.g., frequency domain coefficient limiter 107 of frequency domain coefficient adaptation block 102 of adaptive filter 100 of FIG. 1) to dynamically adjust a frequency domain coefficient magnitude Limit based on frequency domain coefficients of the adaptive filter (e.g., according to blocks 208 and 212 of FIG. 2) in accordance with an alternate embodiment of the present disclosure. FIG. 4 is similar in many respects to FIG. 3 and like-numbered blocks are similar. However, FIG. 4 includes block 402 that replaces block 302 of FIG. 3; decision block 412 to which operation proceeds from decision block 306 (rather than to block 322 of FIG. 3) if the frequency domain coefficient magnitude has now dropped below the Limit threshold; block 414; decision block 416; block 418; and block 422 that replaces block 322 of FIG. 3.

At block 402, the adaptive filter dynamically adjusts the frequency domain coefficient magnitude Limit parameter based on the peak magnitude of the index k+1 frequency domain coefficients calculated at block 206, e.g., according to equation (9) above, e.g., as at block 302 of FIG. 3. Additionally, the adaptive filter dynamically adjusts a second frequency domain coefficient magnitude Limit2 parameter based on a valley coefficient magnitude of the index k+1 frequency domain coefficients calculated at block 206, e.g., according to equation (10) above. The valley magnitude may not necessarily be the smallest coefficient magnitude among all the frequency bins (e.g., the early and late frequency bins may have smaller magnitude coefficients); however, the valley magnitude is the magnitude of the coefficient of the frequency bin that, after the MAXFREQBIN, has the first local minimum, denoted MINFREQBIN in FIG. 7B.

At decision block 412, a determination is made whether the current frequency bin index m is equal to MINFREQBIN, which is the valley frequency bin, as shown in FIG. 7B. If so, operation proceeds to decision block 416; otherwise, operation proceeds to block 414.

At block 414, the frequency bin index m is incremented. Operation returns to decision block 412.

At decision block 416, a determination is made whether the magnitude $|w_m^f(k+1)|$ of the coefficient of the current frequency bin m is greater than the second frequency domain coefficient magnitude Limit2 threshold dynamically adjusted at block 402 to detect the condition that the frequency domain coefficient magnitude, proceeding from lower frequency to higher frequency, has risen above the Limit2 threshold, which is indicated at the Engagement frequency in FIG. 7B. If so, operation proceeds to decision block 422; otherwise, operation proceeds to block 418.

At block 418, the frequency bin index m is incremented. Operation returns to decision block 416.

At block 422, the magnitude $|w_m^f(k+1)|$ of the coefficient of the current frequency bin m is limited to the second Limit2 threshold, e.g., according to equation (8) above, since the frequency bin m is beyond the Engagement frequency bin. In one embodiment, the lesser of the first and second frequency domain coefficient magnitude Limit and Limit2 thresholds is used to limit the magnitude of the coefficient. Operation proceeds to decision block 324 and operation continues as described with respect to FIG. 3.

FIG. 8A illustrates an example wireless telephone 10 in accordance with embodiments of the present disclosure shown in proximity to a human ear 5. Wireless telephone 10 is an example of an ANC-enabled portable audio device in which frequency domain coefficient-based dynamic adaptation control of adaptive filter techniques in accordance with embodiments of this disclosure may be employed. Wireless telephone 10 may include a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. A near-speech microphone NS may be provided to capture near-end speech, which is transmitted from wireless telephone 10 to the other conversation participant(s).

Wireless telephone 10 may include ANC circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when wireless telephone 10 is in close proximity to ear 5. In other embodiments, additional reference and/or error microphones may be employed. Circuit 14 within wireless telephone 10 may include an audio CODEC integrated circuit (IC) 20 that receives the signals from reference microphone R, near-speech microphone NS, and error microphone E and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the portable audio device, such as an MP3 player-on-a-chip integrated circuit. In these and other embodiments, the circuits and techniques disclosed herein may be implemented partially or fully in software and/or firmware embodied in computer-readable media and executable by a controller or other processing device, such as processing element PROC of IC 20 that may perform operations for implementing a frequency domain adaptive filter as described herein. A processing element is an electronic circuit capable of fetching program instructions stored in addressed memory locations and executing the fetched instructions. IC 20 may also include a non-volatile memory.

In general, the ANC system of portable audio device 10 measures ambient acoustic events (as opposed to the output of speaker SPKR and/or the near-end speech) impinging on reference microphone R, and by also measuring the same ambient acoustic events impinging on error microphone E, ANC processing circuits of wireless telephone 10 adapt an anti-noise signal generated from the output of reference microphone R to have a characteristic that minimizes the amplitude of the ambient acoustic events at error microphone E. Because an acoustic path P(z) extends from reference microphone R to error microphone E, ANC circuits are effectively estimating acoustic path P(z) while removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to wireless telephone 10, when wireless telephone 10 is not firmly pressed to ear 5. While the illustrated wireless telephone 10 includes a two-microphone ANC system with a third near-speech microphone NS, some aspects and embodiments of the present disclosure may be practiced in a system that does not include separate error and reference microphones, or a wireless telephone that uses near-speech microphone NS to perform the function of the reference microphone R. Also, in portable audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes.

FIG. 8B depicts an example of a wireless telephone 10 having a headset assembly 13 coupled to it via audio port 15 in accordance with embodiments of the present disclosure. Audio port 15 may be communicatively coupled to RF integrated circuit 12 and/or CODEC IC 20, thus permitting communication between components of headset assembly 13 and one or more of RF integrated circuit 12 and/or CODEC IC 20 (e.g., of FIG. 8A). In other embodiments, the headset assembly 13 may connect wirelessly to the wireless telephone 10, e.g., via Bluetooth or other short-range wireless technology. As shown in FIG. 1B, headset assembly 13 may include a combox 16, a left headphone 18A, and a right headphone 8B. As used in this disclosure, the term "headset" broadly includes any loudspeaker and structure associated therewith that is intended to be mechanically held in place proximate to a listener's ear canal, and includes without limitation earphones, earbuds, and other similar devices. As more specific examples, "headset" may refer but is not limited to intra-concha earphones, supra-concha earphones, and supra-aural earphones.

Combox 16 or another portion of headset assembly 13 may have a near-speech microphone NS to capture near-end speech in addition to or in lieu of near-speech microphone NS of wireless telephone 10. In addition, each headphone 18A, 18B may include a transducer, such as speaker SPKR, that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close to a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein.

In other embodiments, headset assembly 13 is an example of an ANC-enabled portable audio device in which techniques in accordance with embodiments of this disclosure may be employed. A CODEC IC having a processing element PROC and non-volatile memory similar to CODEC ID 20 of FIG. 8A or another circuit may be present within headset assembly 13, communicatively coupled to reference microphone R, near-speech microphone NS, and error microphone E, and configured to perform active noise cancellation as described herein. In such embodiments, an acoustic path having a transfer function P(z) that extends from the reference microphone R to the error microphone E similar to that described with respect to FIG. 8A may also exist with respect to the headset assembly 13. Additionally in such embodiments, an electro-acoustic path having a transfer function S(z) that represents the response of the audio output circuits of the CODEC IC of the headset assembly 13 and the acoustic/electric transfer function of speaker SPKR including the coupling between speaker SPKR and error microphone E, similar to those described with respect to FIG. 8A, may also exist with respect to the headset assembly 13.

FIG. 9 is an example block diagram of an ANC system 900 that includes frequency domain adaptation blocks 102A and 102B that perform frequency domain coefficient-based dynamic adaptation control of adaptive filters W(z) and SE(z), respectively, each of which may be an instance of adaptive filter 100 of FIG. 1, in accordance with embodiments of the present disclosure. The ANC system 900 may be employed in an ANC-enabled portable audio device such as those described with respect to FIGS. 8A and 8B, for example.

The ANC system 900 includes a speaker SPKR, a reference microphone R and an error microphone E (e.g., of FIG. 8A or FIG. 8B). Shown in FIG. 9 is an acoustic path P(z) that extends from reference microphone R to error microphone E, as described above with respect to FIGS. 8A and 8B, as well as an electro-acoustic path S(z) that represents the response of the audio output circuits of CODEC IC 20 and the acoustic/electric transfer function of speaker SPKR. Ambient noise impinges upon reference microphone R which responsively generates a reference microphone signal x(n). The ambient noise passes through acoustic path P(z) and emerges as an acoustic ambient noise signal d(n) that impinges on error microphone E, which generates an error microphone signal e(n) in response to acoustic ambient noise signal d(n) and the output of speaker SPKR. Preferably, the ANC system 900 also includes analog-to-digital converters (ADC) and digital-to-analog (DAC) (not shown). For example, an ADC may convert an analog signal generated by the reference microphone R into the digital reference signal x(n), an ADC may convert an analog signal generated by the error microphone E into the digital error signal e(n), and a DAC may convert a digital signal output by the summing element that sums the digital anti-noise signal y(n) and the digital playback signal pb(n) into an analog signal that is provided (e.g., through an amplifier) to the speaker SPKR.

The ANC system 900 also includes an adaptive anti-noise filter W(z) that adaptively models a transfer function that is the quotient of acoustic path P(z) and electro-acoustic path S(z). Adaptive filter W(z) receives and filters reference microphone signal x(n) to generate anti-noise signal y(n). The goal is that when anti-noise signal y(n) passes through electro-acoustic path S(z) it will emerge from speaker SPKR as an acoustic signal that essentially cancels acoustic ambient noise signal d(n) at error microphone E. The filter coefficients for adaptive filter W(z) are provided by a frequency domain adaptation block 102A. The frequency domain adaptation block 102A performs frequency domain coefficient-based dynamic adaptation control of adaptive filter W(z), e.g., dynamic adjustment of step size and/or leakage parameters based on frequency domain coefficients of the adaptive filter and dynamic adjustment of a frequency domain coefficient magnitude coefficient limit based on the frequency domain coefficients of the adaptive filter, embodiments of which are described herein.

The ANC system 900 also includes an adaptive electro-acoustic path estimation filter SE(z) and a copy of electro-acoustic path estimation filter SE(z) copy. Adaptive filter SE(z) estimates the transfer function of path S(z). Adaptive filter SE(z) filters a playback signal pb(n) to generate a signal py(n) that represents the playback audio that is expected to be delivered to error microphone E. The filter coefficients for adaptive filters SE(z) and SE(z) copy are provided by a frequency domain adaptation block 102B. The frequency domain adaptation block 102B performs frequency domain coefficient-based dynamic adaptation control of adaptive filter SE(z), e.g., dynamic adjustment of step size and/or leakage parameters based on frequency domain coefficients of the adaptive filter and dynamic adjustment of a frequency domain coefficient magnitude coefficient limit based on the frequency domain coefficients of the adaptive filter, embodiments of which are described herein. Adaptive filter SE(z) copy filters reference microphone signal x(n) to generate an output signal that is provided to frequency domain adaptation block 102A.

A first summing element combines playback signal pb(n) and anti-noise signal y(n) to generate a signal provided to speaker SPKR that responsively generates audio output that impinges upon error microphone E. In some embodiments the first summing element may also combine a distant speech signal and/or a near speech signal. A second summing element subtracts the output signal py(n) of filter SE(z) from error microphone signal e(n) to generate a playback corrected error signal pbce(n). The pbce(n) signal is equal to error microphone signal e(n) after removal of playback signal pb(n) as filtered by filter SE(z) to represent the expected playback audio delivered to error microphone E. Stated alternatively, the pbce(n) signal includes the content of error microphone signal e(n) that is not due to the playback signal pb(n).

Frequency domain adaptation block 102A performs adaptation of the coefficients for filter W(z), including dynamic adjustment of step size and/or leakage parameters and/or a frequency domain coefficient magnitude coefficient limit based on frequency domain coefficients of the adaptive filter W(z), based on frequency domain versions of the output signal of filter SE(z) copy and playback corrected error signal pbce(n). Frequency domain adaptation block 102B performs adaptation of the coefficients for filter SE(z) and SE(z) copy, including dynamic adjustment of step size and/or leakage parameters and/or a frequency domain coefficient magnitude coefficient limit based on frequency domain coefficients of the adaptive filter SE(z), based on frequency domain versions of playback signal pb(n) and playback corrected error signal pbce(n). In other embodiments, the adaptive filter 100 may be employed to estimate a model of an acoustic path (commonly referred to as L) from the speaker SPKR to the reference microphone R, which may be employed in the ANC system to compensate for acoustic energy generated by the speaker SPKR that is picked up by the reference microphone R and transduced as a component of the reference signal x(n). Although an embodiment of an ANC system is shown in FIG. 9, other embodiments are contemplated that use one or more adaptive filters that include a frequency domain adaptation block that performs frequency domain coefficient-based dynamic adaptation control of an adaptive filter, e.g., dynamic adjustment of step size and/or leakage parameters based on frequency domain coefficients of the adaptive filter and dynamic adjustment of a frequency domain coefficient magnitude coefficient limit based on the frequency domain coefficients of the adaptive filter.

Although an embodiment of an adaptive filter that includes a frequency domain adaptation block that performs frequency domain coefficient-based dynamic adaptation control of an adaptive filter employed in an ANC system such as ANC system 900 has been described, other applications may employ such an adaptive filter, such as channel identification, plant identification and control, echo cancellation, adaptive noise cancelling, channel equalization, linear predictive coding, adaptive line enhancement, etc.

FIG. 10 is an example block diagram of an adaptive filter 1000 that includes a frequency domain coefficient adaptation block 102 that performs frequency domain coefficient-based dynamic adaptation control of adaptive filter in accordance with embodiments of the present disclosure. The adaptive filter 1000 includes a frequency domain filter W(z) that receives a frequency domain input signal $x^f(k)$ and frequency domain filter coefficients 122 from the frequency domain adaptation block 102. For each sample block k, the frequency domain filter W(z) applies the frequency domain filter coefficients 122 to the frequency domain input signal $x^f(k)$ to produce a frequency domain output signal $y^f(k)$. The frequency domain output signal $y^f(k)$ may be converted into a time domain output signal, e.g., via an IFFT block (not shown). In many respects, the frequency domain adaptation block 102 is similar to the frequency domain adaptation block 102 of FIG. 1, except that the frequency domain coefficients 122 are provided directly to the frequency domain filter W(z) rather than being first converted to time domain coefficients. Nevertheless, the frequency domain adaptation block 102 of FIG. 10 also performs frequency domain coefficient-based dynamic adaptation control of adaptive filter. The adaptive filter 100 of FIG. 1 may be characterized as a "delay-less" filter, whereas the adaptive filter 1000 of FIG. 10 may include delay due to conversion of a time domain input signal to a frequency domain input signal. Nevertheless, it may be observed from FIG. 10 that an adaptive filter that performs frequency domain coefficient-based dynamic adaptation control of adaptive filter may include a frequency domain filter and may be employed in various applications, such as an ANC system or other application that is tolerable of delay in its adaptive filter.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. An adaptive filter, comprising:
a digital signal processor programmed to:
  calculate frequency domain coefficients of the adaptive filter that has a leakage/step size parameter that controls adaptation of the adaptive filter; and
  dynamically adjust the leakage/step size parameter in the frequency domain based on the calculated frequency domain coefficients of the adaptive filter.

2. The adaptive filter of claim 1,
wherein the frequency domain coefficients are calculated based on frequency domain input and error signals converted from a current sample of time domain input and error signals to the adaptive filter; and
wherein the dynamically adjusted leakage/step size parameter is used to calculate frequency domain coefficients based on frequency domain input and error signals converted from a next sample of time domain input and error signals after the current sample of time domain input and error signals.

3. The adaptive filter of claim 1,
wherein to dynamically adjust the leakage/step size parameter in the frequency domain based on the calculated frequency domain coefficients of the adaptive filter, the digital signal processor is further programmed to dynamically adjust the leakage/step size parameter in the frequency domain based on a peak magnitude among the calculated frequency domain coefficients of the adaptive filter.

4. The adaptive filter of claim 1,
wherein each of the frequency domain coefficients has an associated frequency bin and leakage/step size parameter; and
wherein to dynamically adjust the leakage/step size parameter in the frequency domain based on the calculated frequency domain coefficients of the adaptive filter, the digital signal processor is further programmed to:
  for each frequency bin of the frequency bins, dynamically adjust the leakage/step size parameter of the frequency bin based on a magnitude of the frequency domain coefficient corresponding to the frequency bin.

5. The adaptive filter of claim 1,
wherein to dynamically adjust the leakage/step size parameter, the digital signal processor is further programmed to:
  strengthen the leakage/step size parameter approximately proportionally to a magnitude of one or more of the calculated frequency domain coefficients.

6. The adaptive filter of claim 1, further comprising:
wherein the adaptive filter is used in an active noise cancellation system to generate an anti-noise signal or to model an electro-acoustic path of an audio device.

7. A method, comprising:
calculating frequency domain coefficients of an adaptive filter that has a leakage/step size parameter that controls adaptation of the adaptive filter; and
dynamically adjusting the leakage/step size parameter in the frequency domain based on the calculated frequency domain coefficients of the adaptive filter.

8. The method of claim 7,
wherein said calculating frequency domain coefficients is based on frequency domain input and error signals converted from a current sample of time domain input and error signals to the adaptive filter; and
wherein the dynamically adjusted leakage/step size parameter is used to calculate frequency domain coefficients based on frequency domain input and error signals converted from a next sample of time domain input and error signals after the current sample of time domain input and error signals.

9. The method of claim 7,
wherein said dynamically adjusting the leakage/step size parameter in the frequency domain based on the calculated frequency domain coefficients of the adaptive filter comprises dynamically adjusting the leakage/step size parameter in the frequency domain based on a peak magnitude among the calculated frequency domain coefficients of the adaptive filter.

10. The method of claim 7,
wherein each of the frequency domain coefficients has an associated frequency bin and leakage/step size parameter; and
wherein said dynamically adjusting the leakage/step size parameter in the frequency domain based on the calculated frequency domain coefficients of the adaptive filter comprises:
  for each frequency bin of the frequency bins, dynamically adjusting the leakage/step size parameter of the frequency bin based on a magnitude of the frequency domain coefficient corresponding to the frequency bin.

11. The method of claim 7,
wherein said dynamically adjusting the leakage/step size parameter comprises:
  strengthening the leakage/step size parameter approximately proportionally to a magnitude of one or more of the calculated frequency domain coefficients.

12. The method of claim 7, further comprising:
wherein the adaptive filter is used in an active noise cancellation system to generate an anti-noise signal or to model an electro-acoustic path of an audio device.

13. An adaptive filter, comprising:
a digital signal processor programmed to:
  calculate frequency domain coefficients of the adaptive filter based on frequency domain input and error signals;
  dynamically adjust a frequency domain coefficient magnitude limit parameter based on the calculated frequency domain coefficients; and
  use the dynamically adjusted frequency domain coefficient magnitude limit parameter to limit a magnitude of the calculated frequency domain coefficients.

14. The adaptive filter of claim 13,
wherein to dynamically adjust the frequency domain coefficient magnitude limit parameter based on the calculated frequency domain coefficients, the digital signal processor is further programmed to dynamically adjust the frequency domain coefficient magnitude limit parameter based on a peak magnitude among the calculated frequency domain coefficients.

15. The adaptive filter of claim 14, further comprising:
wherein the digital signal processor is further programmed to:
  determine the peak magnitude by examining the magnitudes of the calculated frequency domain coefficients from low frequency to high frequency;
  calculate the frequency domain coefficient magnitude limit parameter based on the peak magnitude;
  subsequently determine an engagement frequency at which the magnitude drops below the calculated frequency domain coefficient magnitude limit parameter; and
  use the calculated frequency domain coefficient magnitude limit parameter to limit the magnitude of only the frequency domain coefficients associated with frequencies above the engagement frequency.

16. The adaptive filter of claim 15, further comprising:
wherein the digital signal processor is further programmed to:
  determine a valley magnitude after determining the peak magnitude;
  calculate a second frequency domain coefficient magnitude limit parameter based on the valley magnitude;
  subsequently determine a second engagement frequency at which the magnitude rises above the calculated second frequency domain coefficient magnitude limit parameter; and
  use the calculated second frequency domain coefficient magnitude limit parameter to limit the magnitude of only the frequency domain coefficients associated with frequencies above the second engagement frequency.

17. The adaptive filter of claim 13,
wherein to dynamically adjust the frequency domain coefficient magnitude limit parameter based on the calculated frequency domain coefficients, the digital signal processor is further programmed to:
  increase the frequency domain coefficient magnitude limit parameter approximately proportionally to a magnitude of one or more of the calculated frequency domain coefficients.

18. The adaptive filter of claim 13, further comprising:
wherein the adaptive filter is used in an active noise cancellation system to generate an anti-noise signal or to model an electro-acoustic path of an audio device.

19. A method, comprising:
calculating frequency domain coefficients of an adaptive filter based on frequency domain input and error signals;
dynamically adjusting a frequency domain coefficient magnitude limit parameter based on the calculated frequency domain coefficients; and
using the dynamically adjusted frequency domain coefficient magnitude limit parameter to limit a magnitude of the calculated frequency domain coefficients.

20. The method of claim 19,
wherein said dynamically adjusting the frequency domain coefficient magnitude limit parameter based on the calculated frequency domain coefficients comprises dynamically adjusting the frequency domain coefficient magnitude limit parameter based on a peak magnitude among the calculated frequency domain coefficients.

21. The method of claim 20, further comprising:
determining the peak magnitude by examining the magnitudes of the calculated frequency domain coefficients from low frequency to high frequency;
calculating the frequency domain coefficient magnitude limit parameter based on the peak magnitude;
subsequently determining an engagement frequency at which the magnitude drops below the calculated frequency domain coefficient magnitude limit parameter; and
using the calculated frequency domain coefficient magnitude limit parameter to limit the magnitude of only the frequency domain coefficients associated with frequencies above the engagement frequency.

22. The method of claim 21, further comprising:
determining a valley magnitude after said determining the peak magnitude;
calculating a second frequency domain coefficient magnitude limit parameter based on the valley magnitude;
subsequently determining a second engagement frequency at which the magnitude rises above the calculated second frequency domain coefficient magnitude limit parameter; and
using the calculated second frequency domain coefficient magnitude limit parameter to limit the magnitude of only the frequency domain coefficients associated with frequencies above the second engagement frequency.

23. The method of claim 19,
wherein said dynamically adjusting the frequency domain coefficient magnitude limit parameter based on the calculated frequency domain coefficients comprises:
  increasing the frequency domain coefficient magnitude limit parameter approximately proportionally to a magnitude of one or more of the calculated frequency domain coefficients.

24. The method of claim 19, further comprising:
wherein the adaptive filter is used in an active noise cancellation system to generate an anti-noise signal or to model an electro-acoustic path of an audio device.

\* \* \* \* \*